(12) United States Patent
Fujii et al.

(10) Patent No.: US 8,541,099 B2
(45) Date of Patent: Sep. 24, 2013

(54) HEAT-RESISTANT RESIN

(75) Inventors: Hirofumi Fujii, Ibaraki (JP); Yoshio Terada, Ibaraki (JP); Kazumasa Igarashi, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 687 days.

(21) Appl. No.: 12/350,764

(22) Filed: Jan. 8, 2009

(65) Prior Publication Data

US 2009/0130432 A1    May 21, 2009

Related U.S. Application Data

(63) Continuation of application No. 11/665,772, filed as application No. PCT/JP2005/019219 on Oct. 19, 2005, now abandoned.

(30) Foreign Application Priority Data

Oct. 19, 2004   (JP) .............................. P.2004-304028
Oct. 12, 2005   (JP) .............................. P.2005-297734

(51) Int. Cl.
    *B32B 27/06*    (2006.01)
(52) U.S. Cl.
    USPC ........... 428/327; 428/348; 428/446; 428/447; 528/310
(58) Field of Classification Search
    USPC .................. 428/348, 327, 446, 447; 528/310
    See application file for complete search history.

(56) References Cited

U.S. PATENT DOCUMENTS

| 6,217,996 | B1 | 4/2001 | Yamamoto et al. | |
| 6,300,037 | B1 * | 10/2001 | Fujii et al. ................... | 430/270.1 |
| 6,364,465 | B1 * | 4/2002 | Chandrasekaran ............. | 347/65 |
| 2003/0136430 | A1 * | 7/2003 | Namikawa et al. ............. | 134/32 |

FOREIGN PATENT DOCUMENTS

| CN | 1149538 C | 5/2004 |
| JP | 47-43197 A | 12/1972 |
| JP | 2-74947 A | 3/1990 |
| JP | 5-170901 A | 7/1993 |
| JP | 5-230212 A | 9/1993 |
| JP | 6-43648 A | 2/1994 |
| JP | 6-73178 A | 3/1994 |
| JP | 6-207024 A | 7/1994 |
| JP | 2000-103848 A | 4/2000 |
| JP | 2001-22063 A | 1/2001 |
| JP | 2002-050854 A | 2/2002 |
| JP | 2005-091421 A | 4/2005 |

OTHER PUBLICATIONS

Huntsman commercial booklet," The Jeffamine polyetheramines", www. Hunsman.com 2007.*
Lin et al Preparation and Properties of Conductive Polyimide Films, Journal of Polymer Research, 9, 189-194, 2002.*
Huntsman commercial booklet,"The Jeffamine polyetheramines", www.Hunsman.com 2007.
Chinese Office Action dated Mar. 20, 2009.
Office Action issued by the Korean Patent Office dated Dec. 28, 2010 from a foreign patent office in a counterpart application No. 10-2007-7011350.
Communication from the Korean Intellectual Property Office dated Sep. 28, 2011 in counterpart application No. 10-2007-7011350.
Communication dated Nov. 6, 2012 issued by the European Patent Office in counterpart European Patent Application No. 05795381.2.
Taiwanese Office Action, issued Jul. 11, 2011 in corresponding Taiwanese Patent Application No. 094136473.
Communication dated Jun. 25, 2012 from the Korean Intellectual Property Office in counterpart Korean application No. Oct. 2007-7011350.
Communication dated Jun. 3, 2013 from the European Patent Office in counterpart European application No. 05795381.2.

* cited by examiner

*Primary Examiner* — Gregory Listovoyb
(74) *Attorney, Agent, or Firm* — Sughrue Mion, PLLC

(57) ABSTRACT

The present invention provides a low-modulus low-stress resin which has such heat resistance that cohesive force and reliability can be retained even at high temperatures and which is applicable as various functional materials. The resin is a thermoplastic resin having a modulus of elasticity at room temperature, 25° C., of 1 GPa or lower and a modulus of elasticity at 250° C. of 1 MPa or higher, or a precursor resin thereof.

8 Claims, 1 Drawing Sheet

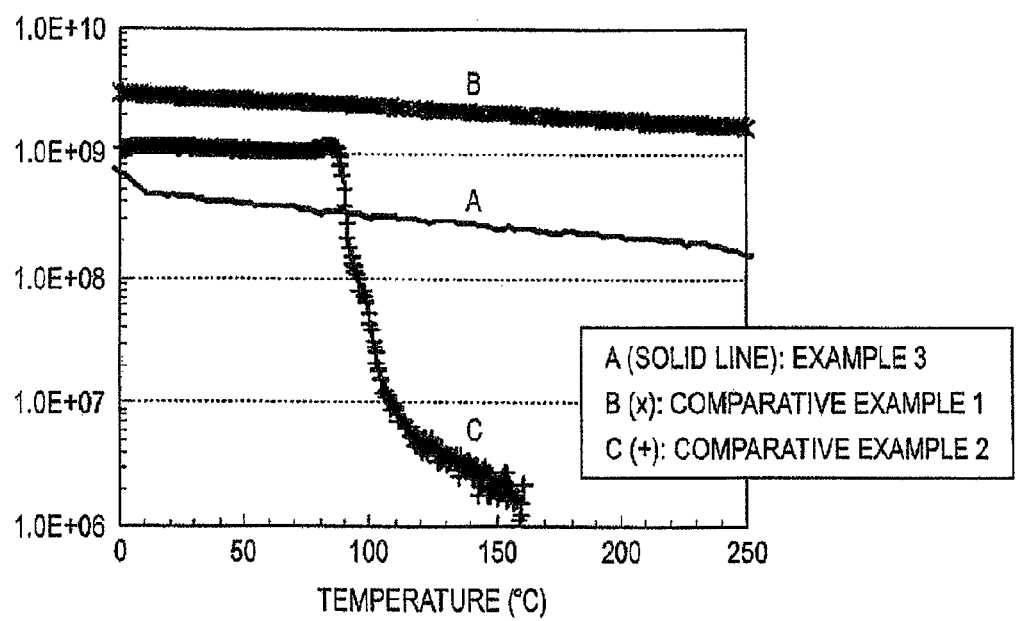

HEAT-RESISTANT RESIN

CROSS-REFERENCE TO RELATED APPLICATION

This application is a continuation of application Ser. No. 11/665,772 filed Apr. 19, 2007, now abandoned which is a National Stage Application filed under §371 of PCT Application No. PCT/JP05/019219 filed Oct. 19, 2005. The entire disclosure of the prior application, application Ser. No. 11/665,772 is hereby incorporated by reference.

BACKGROUND ART

Thermoplastic resins which have hitherto been known as low-modulus resins and resins which are soluble in solvents have a glass transition point below or around room temperature and have had a problem concerning high-temperature reliability. For example, in applications such as the mounting of semiconductor parts on a substrate, a temperature of 250° C. or higher is practically necessary for solder melting. However, the resins having a low glass transition point melt at such temperatures, and the resins themselves deform and are unsuitable for such use. Furthermore, there have been problems concerning the formation of voids or interfacial separation attributable to the volatilization or condensation of water contained in these resins, and concerning resultant package cracking, etc.

For eliminating those problems, investigations were made on a curable resin having a crosslinking structure introduced therein or on a resin having a high glass transition temperature. However, the curable resin has a problem that stress generation by cure shrinkage is unavoidable.

On the other hand, the resin having a high glass transition point has a high modulus of elasticity at desired heat-resistance temperature. Because of this high modulus of elasticity, the stress generated by a difference in the coefficient of thermal (linear) expansion between the substrate and the resin during a high-temperature processing or subsequent cooling may pose a problem. In this case, no problem arises when the coefficient of thermal (linear) expansion of each of the materials constituting the structure to be formed is equal to the coefficient of thermal (linear) expansion of the resin in the temperature range in each processing. However, such structures have had a problem that the design itself of the structures is considerably restricted.

Low-modulus polyimides are being used as a low-stress heat-resistant material for forming protective films for semiconductors, insulating films in multilayered circuit boards, adhesive films for semiconductors, coverlays for flexible circuit boards, and the like (see patent documents 1 to 6).

However, these low-modulus polyimides have been unable to be used in applications where contamination by a silicone may arouse a serious trouble, such as HDD applications and some semiconductor applications, since these low-modulus polyimides are obtained by copolymerizing a diamine or tetracarboxylic anhydride containing a silicone.

There has hence been a desire for a low-modulus heat-resistant resin which can be used in, e.g., an apparatus for HDD or semiconductor production without causing contamination.

Patent Document 1: JP-A-5-170901
Patent Document 2: JP-A-6-73178
Patent Document 3: JP-A-6-207024
Patent Document 4: JP-A-6-73178
Patent Document 5: JP-A-2002-50854
Patent Document 6: JP-A-2000-103848

DISCLOSURE OF THE INVENTION

Problem that the Invention is to Solve

The invention provides a low-modulus low-stress resin having such heat resistance that cohesive force and reliability can be retained even at high temperatures.

Means for Solving the Problem

According to the invention, a resin having a reduced temperature dependence of the modulus of elasticity and having elastic-modulus values of from 1 GPa to 1 MPa at temperatures in the range of from room temperature to 250° C. can be obtained by regulating the chemical structure of a thermoplastic resin. This resin is an excellent low-modulus low-stress resin having such heat resistance that cohesive force and reliability can be retained even at high temperatures.

Namely, the invention has been achieved by the following constitutions.

(1) A thermoplastic resin having a modulus of elasticity at room temperature, 25° C., of 1 GPa or lower and a modulus of elasticity at 250° C. of 1 MPa or higher, or a precursor resin thereof.

(2) The thermoplastic resin according to claim 1, which has no sea-island structure of 0.1 μm or larger and is transparent, or a precursor resin thereof.

(3) The thermoplastic resin according to (1) or (2), which has a siloxane content of lower than 10% by mass, or a precursor resin thereof.

(4) The thermoplastic resin according to any one of (1) to (3), which is a polyimide resin obtainable by reacting a tetracarboxylic dianhydride with a diamine compound, said diamine compound being a diamine compound which has two ends having an amine structure and has a polyether structure, or a precursor resin thereof.

(5) The thermoplastic resin according to (4), wherein the diamine compound, which has two ends having an amine structure and has a polyether structure, has a number-average molecular weight of 500 or higher; and wherein the resin contains the polyether structure of the diamine compound in a proportion of 40 to 60% by mass, or a precursor resin thereof.

(6) A photosensitive resin composition comprising the thermoplastic resin according to any one of (1) to (5) or a precursor resin thereof; and a photosensitizing agent.

(7) The photosensitive resin composition according to (6), which comprises:
the polyimide resin according to (4) or (5) or a precursor resin thereof; and
a 1,4-dihydropyridine compound represented by the formula (I):

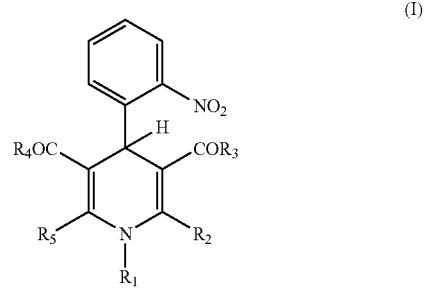

wherein $R_1$ to $R_5$ each independently represent a hydrogen atom or an organic group having 1 to 4 carbon atoms.

(8) A resin composition comprising the thermoplastic resin according to (4) or (5) or a precursor resin thereof; and a carbon powder.

Advantages of the Invention

According to the invention, a thermoplastic resin having low stress and high reliability can be provided; such resin has hitherto been difficult to produce. When the resin of the invention is formulated into functional resins such as a photosensitive resin and a conductive resin, these resins can have both of low stress and high reliability.

BEST MODE FOR CARRYING OUT THE INVENTION

The invention provides a thermoplastic resin having low stress and heat resistance, and a process for producing the same.

The low-modulus heat-resistant thermoplastic resin of the invention has a modulus of elasticity at 25° C. of 1 GPa or lower and a modulus of elasticity at 250° C. of 1 MPa or higher.

The modulus of elasticity at 25° C. is preferably 0.8 GPa or lower, especially preferably 0.5 GPa or lower, and the modulus of elasticity at 250° C. is preferably 10 MPa or higher.

The term thermoplastic resin as used herein means a linear polymeric compound having no three-dimensional crosslinked structure. Examples of such polymers include condensation materials such as polyimides, polyamideimides, polyesterimides, polyesters, polyamides, polybenzoxazole, polycarbodiimide, and polycarbonates.

Hitherto, low-stress resins can be materials having a crosslinked structure and a glass transition point (Tg) lower than or around room temperature, and many of these are composites with an inorganic material or high-modulus resin. There has been a possibility that even a resin having a microphase-separated structure (sea-island structure) can be such a resin. However, the former has had a problem that cure shrinkage generates a stress, while the latter has had problems that such a phase structure is quite difficult to control and that even if such a structure is obtainable, practical heat resistance is not obtained because the domains constituting one of the separated phases have a modulus of elasticity of 1 MPa or lower. Many of the low-modulus resins containing a siloxane belong to the latter.

The invention relates especially to a non-silicone resin having a siloxane content of lower than 10% by mass.

The invention can provide a transparent thermoplastic resin which has a siloxane content of lower than 10% by mass and has no sea-island structure (microphase-separated structure) of 0.1 μm or larger.

The term, "transparent" as used herein means that the resin is free from clouding in a visual examination and that when the resin is subjected to any dyeing treatment and a section thereof is examined with a transmission electron microscope (TEM), then no structure of 0.1 μm or larger can be observed.

The thermoplastic resin of the invention can be obtained by regulating the structure thereof on a molecular level. Namely, it can be obtained by copolymerizing a linear polymer having a high Tg (high-Tg resin) with a resin having a Tg not higher than room temperature (low-Tg resin) and regulating the chemical compatibility between these resins and the molecular weight of the low-Tg resin.

When the high-Tg resin has a high modulus of elasticity, the low-Tg resin is copolymerized in a larger proportion.

When the high-Tg resin has a low modulus of elasticity, the low-Tg resin is copolymerized in a smaller proportion.

The high-Tg resin is a heat-resistant polymer having a Tg of 250° C. or higher. Examples thereof include polyimides, polyamideimides, polyesterimides, polyesters, polyamides, polybenzoxazole, polycarbodiimide, and polycarbonates. The Tg of the high-Tg resin is preferably 270° C. or higher.

Examples of the low-Tg resin to be copolymerized with the high-Tg resin include end-modified compounds represented by liquid elastomers, such as polyalkylene oxides, polyacrylates, polybutadiene, hydrogenated polybutadiene, and polybutadiene/acrylonitrile copolymers. Appropriate terminal groups enable the low-Tg resin to be copolymerized with the high-Tg resin. The Tg of the low-Tg resin is preferably −20° C. or lower.

The number-average molecular weight of the low-Tg resin is generally 200 to 10,000, preferably 500 to 5,000.

Examples of the terminal groups include amino, carboxyl, and hydroxyl. Modification with terminal groups only (bifunctional structure) prevents the formation of a three-dimensional crosslinked structure.

The proportion (ratio by mass) of the high-Tg resin to the low-Tg resin is preferably from 1:2 to 2:1.

The number-average molecular weight of the thermoplastic resin obtained is generally 10,000 to 1,000,000. However, the molecular weight should not be construed as being limited to these.

In the case that the low-Tg resin has too high a compatibility with the high-Tg resin, the modulus of elasticity at 250° C. is deteriorated. In the case that the low-Tg resin has too low a compatibility with the high-Tg resin, a sea-island structure (microphase-separated structure) is formed and the desired properties cannot be obtained.

A sea-island structure (microphase-separated structure) can be observed by dyeing a sample with appropriate metal ions and examining the dyed sample with a transmission electron microscope (TEM). For example, dyeing with osmic acid enables a sea-island structure in a resin having a polybutadiene structure to be observed.

The compatibility is a chemical affinity between the low-Tg resin ingredient and the high-Tg resin ingredient. It is preferred that the two ingredients be present in a uniform concentration in the resin and that the resin has the feature of the high-Tg resin ingredient (high Tg).

The thermoplastic resin of the invention may be obtained in the following manner. A precursor (precursor resin) for the resin is applied and then subjected to a post-treatment such as heating, to thereby convert the precursor to the target resin of the invention. Furthermore, use may be made of a method in which an additive such as a photosensitizing agent or conductive agent is added to a precursor resin to obtain a photosensitive or conductive composition and this composition is applied and then subjected to a post-treatment such as heating, to obtain a photosensitive or conductive material comprising the target resin having low stress.

Examples of such a precursor resin include polyamic acids as precursor resins for polyimide resins.

Polyimide Resin

As a result of intensive investigations, it was found that among the materials to be used in combination shown above, a polyimide material with which a polyalkylene oxide has been copolymerized is especially satisfactory.

In general, polyimides are heat-resistant resins obtainable by the dehydrating condensation of a polyamic acid as a precursor thereof. The polyamic acid itself can be obtained by reacting an acid dianhydride ingredient with a diamine ingredient in a substantially equimolar proportion in an appropriate organic solvent.

The methods for dehydrating and imidizing the polyamic acid obtained include, for example, the thermal imidization method, azeotropic dehydration method, and chemical imidization method.

In the thermal imidization method, a polyamic acid solution is applied to a substrate, subsequently dried, and heat-treated at a high temperature of generally 200 to 500° C. to cause dehydrating cyclization, whereby a polyimide film can be directly obtained. In the azeotropic dehydration method, a solvent capable of forming an azeotrope with water such as xylene or toluene, is added to a solution of the polyamic acid and water is removed by azeotropic dehydration at 100 to 200° C. to thereby cause dehydrating cyclization, whereby a polyimide can be obtained in the form of a solution. The chemical imidization is a method in which the polyamic acid solution is chemically caused to undergo dehydrating cyclization using a basic catalyst, e.g., a tertiary amine such as pyridine, and a dehydrating agent such as acetic anhydride. In this method, the polyimide obtained is generally precipitated in a poor solvent to remove the pyridine and the acetic acid as a by-product, whereby a polyimide can be obtained as a solid.

The diamine ingredient for obtaining a preferred resin may be a diamine compound which has two ends having an amine structure and has a polyether structure (hereinafter, this compound is referred to as PE diamine compound). The PE diamine compound is preferred from the standpoint of obtaining a low-modulus polyimide resin having high heat resistance and low stress.

The PE diamine compound is not particularly limited so long as it is a compound having a polyether structure and at least two ends having an amine structure. Examples thereof include terminal diamines having a polypropylene glycol structure, terminal diamines having a polyethylene glycol structure, terminal diamines having a polytetramethylene glycol structure, and terminal diamines having two or more of these structures.

For example, PE diamine compounds having two ends having an amine structure which have been prepared from ethylene oxide, propylene oxide, polytetramethylene glycol, a polyamine, or a mixture of these are preferred.

The polyether structure possessed by the PE diamine compound is a structure having two or more alkyleneoxy groups represented by -A-O—. Symbol A represents an alkylene group and O represents an oxygen atom.

The alkylene group represented by A has generally 1 to 10, preferably 2 to 5 carbon atoms. Examples thereof include methylene, ethylene, propylene, and butylene.

The alkyleneoxy groups may be the same or different. The alkylene group represented by A may have substituents (e.g., methyl, polyether, and aminopolyether groups).

The proportion by mass of the polyether structure of the PE diamine compound in the resin is preferably 30% or higher, more preferably 40 to 60%.

The amine structures possessed by the PE diamine compound respectively at both ends may be the same or different and may be any of primary to tertiary ones. However, primary amine structures are preferred.

Examples of the amine structures include methylamine, ethylamine, and propylamine. Propylamine is preferred.

The number-average molecular weight of the PE diamine compound is preferably 500 or higher, more preferably 1,000 to 5,000.

Examples of the PE diamine compound include compounds represented by the formulae (1) to (4).

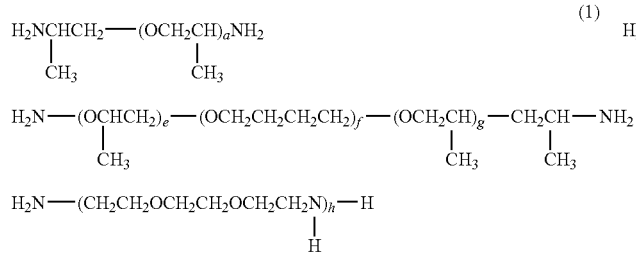

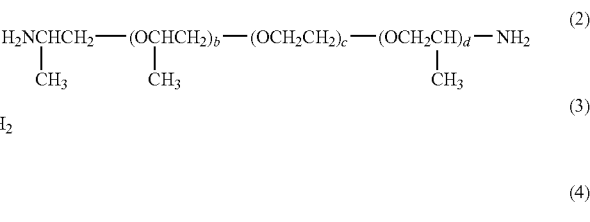

In the formula (1), symbol a represents an integer of 2 or larger, and preferably 5 to 80.

In the formula (2), b, c, and d each represent an integer of 0 or larger, in which b+c+d is 2 or larger and preferably 5 to 50.

In the formula (3), e, f, and g each represent an integer of 0 or larger, in which e+f+g is 2 or larger and preferably 5 to 30.

In the formula (4), h represents an integer of 1 or larger, and preferably 1 to 4.

The PE diamine compound can be synthesized by known methods. A commercial one may also be used.

It is preferred that the diamine ingredient to be reacted with a tetracarboxylic dianhydride should comprise a combination of the PE diamine compound and one or more diamine compounds having no polyether structure. Examples of the diamine compounds to be preferably used in combination include the following aliphatic diamines and aromatic diamines.

Aliphatic Diamine

Examples of aliphatic diamines include ethylenediamine, hexamethylenediamine, 1,8-diaminooctane, 1,10-diaminodecane, 1,12-diaminododecane, 4,9-dioxa-1,12-diaminododecane, and 1,3-bis(3-aminopropyl)-1,1,3,3-tetramethyldisiloxane (α,ω-bisaminopropyltetramethyldisiloxane).

Aliphatic diamines having a molecular weight of generally 50 to 1,000, preferably 100 to 300, may be used.

Aromatic Diamine

Examples of aromatic diamines include 4,4'-diaminodiphenyl ether, 3,4'-diaminodiphenyl ether, 3,3'-diaminodiphenyl ether, m-phenylenediamine, p-phenylenediamine, 4,4'-diaminodiphenylpropane, 3,3'-diaminodiphenylpropane, 4,4'-diaminodiphenylmethane, 3,3'-diaminodiphenylmethane, 4,4'-diaminodiphenyl sulfide, 3,3'-diaminodiphenyl sulfide, 4,4'-diaminodiphenyl sulfone, 3,3'-diaminodiphenyl sulfone, 1,4-bis(4-aminophenoxy)benzene, 1,3-bis(4-aminophenoxy)benzene, 1,3-bis(3-aminophenoxy)benzene, 1,3-bis(4-aminophenoxy)-2,2-dimethylpropane, and 4,4'-diaminobenzophenone.

Preferred of these are 4,4'-diaminodiphenyl ether and p-phenylenediamine.

Tetracarboxylic Dianhydride

The tetracarboxylic dianhydride for synthesizing the heat-resistant resin of the invention is not particularly limited. Examples thereof include 3,3',4,4'-biphenyltetracarboxylic dianhydride, 2,2',3,3'-biphenyltetracarboxylic dianhydride, 3,3',4,4'-benzophenonetetracarboxylic dianhydride, 2,2',3,3'-benzophenonetetracarboxylic dianhydride, 4,4'-oxydiphthalic dianhydride, 2,2-bis(2,3-dicarboxyphenyl)hexafluoropropane dianhydride, 2,2-bis(3,4-dicarboxyphenyl)hexafluoropropane dianhydride (6FDA), bis(2,3-dicarboxyphenyl)methane dianhydride, bis(3,4-dicarboxyphenyl)methane dianhydride, bis(2,3-dicarboxyphenyl)sulfone dianhydride, bis(3,4-dicarboxyphenyl)sulfone dianhydride, pyromellitic dianhydride, and ethylene glycol bistrimellitate dianhydride. These may be used alone or in combination of two or more thereof.

Preferred tetracarboxylic anhydrides include 3,3',4,4'-biphenyltetracarboxylic dianhydride, 4,4'-oxydiphthalic dianhydride, 2,2-bis(3,4-dicarboxyphenyl)hexafluoropropane dianhydride (6FDA), and pyromellitic dianhydride.

Preferred examples of the resin include resins having structures shown below, which are formed by the reaction of any of the diamine compounds represented by the formulae (1) to (4) given above with a tetracarboxylic dianhydride.

In the following formulae, Ar represents a structure including at least one aromatic ring and preferably having 6 to 30 carbon atoms. Examples thereof include a benzene ring, biphenyl, and diphenyl ether.

Symbols a to h are the same as those in the formulae (1) to (4).

amount thereof is preferably 5 to 60%, more preferably 5 to 40% of the stoichiometrically equivalent amount. In this case, the diamine ingredient further includes one or more other diamine compounds such as the aliphatic diamines and aromatic diamines shown above.

The total amount of the PE diamine compound and the other diamine compounds generally is stoichiometrically equivalent to the tetracarboxylic dianhydride. However, the total amount thereof may be 50 to 200% of the stoichiometrically equivalent amount.

Examples of the solvent to be used in the reaction include organic solvents such as N,N-dimethylacetamide, N-methyl-2-pyrrolidone, and N,N-dimethylformamide. Preferred is N-methyl-2-pyrrolidone. For the purpose of regulating the solubility of the raw materials or the resin, a nonpolar solvent such as toluene or xylene can be suitably mixed with that solvent.

The solute concentration in the liquid reaction mixture is generally 5 to 50% by mass. The reaction temperature is generally from room temperature to 220° C. The reaction time is generally 1 to 10 hours, preferably 3 to 6 hours.

The resin or precursor resin obtainable by the method described above can be converted to a resin having further improved heat resistance by subjecting it to a heat treatment at a high temperature preferably in an inert atmosphere.

The temperature at which the high-temperature heat treatment is conducted after solvent removal is desirably 200° C. or higher, preferably 250 to 350° C. The treatment time is generally from 10 minutes to 5 hours, preferably from 30 minutes to 2 hours. For preventing the resin from being oxidatively deteriorated, it is desirable to conduct the heat tem-

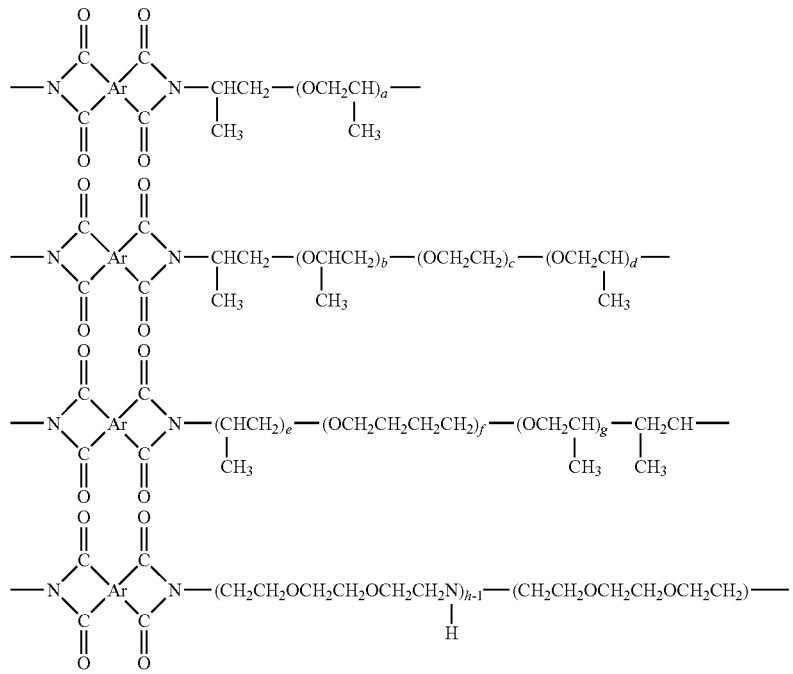

Preparation of Resin and Precursor Resin

The resin or precursor resin of the invention can be obtained by reacting a PE diamine compound with a tetracarboxylic dianhydride generally in a solvent.

The PE diamine compound can be incorporated in an amount up to the amount stoichiometrically equivalent to the amount of the tetracarboxylic dianhydride. However, the perature in an inert atmosphere such as a nitrogen atmosphere or vacuum. This heat treatment not only further improves heat resistance but can completely remove the volatile ingredients remaining in the resin.

Functional Materials

The resin obtained according to the invention can be made to have functions by various methods. Low-stress functional materials which have been unable to be obtained so far can be provided, such as a low-stress photosensitive material and a low-stress conductive material.

In general, the photosensitive resins which have been used for forming structural materials for coverlays, insulating films, and the like are resins having a high Tg or curable resins having a crosslinking structure so as to secure the reliability of the materials. There has hence been a limit to stress reduction. In contrast, when the resin of the invention is used, a low-stress photosensitive material can be obtained.

The photosensitive material can be easily obtained by adding a photosensitizing agent to the resin or precursor resin of the invention. It can be used for image formation.

For example, a 1,4-dihydropyridine compound represented by the formula (I), which has photosensitivity, is dissolved in the polyamic acid solution (resin precursor solution) obtained by the method described above, whereby a composition capable of forming a low-stress photosensitive polyimide resin can be easily prepared.

This photosensitive polyimide resin composition is formed into a thin film and irradiated with light through a mask. Thus, a negative pattern can be formed.

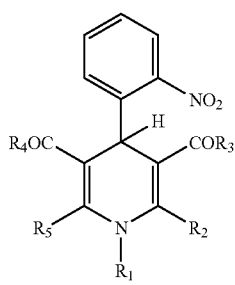

(I)

In the formula (I), $R_1$ to $R_5$ each independently represent a hydrogen atom or an organic group having 1 to 4 carbon atoms.

Examples of the organic groups having 1 to 4 carbon atoms represented by $R_1$ to $R_5$ include methyl, ethyl, n-propyl, isopropyl, tert-butyl, and n-butyl.

Other examples of the photosensitizing agent include photo-radical generators represented by diazonaphthoquinone derivatives and α-hydroxyketone derivatives and photo-acid generators represented by triazine derivatives and iodonium salt derivatives.

The amount of the photosensitizing agent to be added is generally 0.5 to 50 parts by mass, preferably 10 to 20 parts by mass, per 100 parts by mass of the resin or precursor resin of the invention.

On the other hand, the conductive material can be easily obtained by adding a conductive agent such as a carbon powder, to the resin or precursor resin of the invention and dispersing the conductive agent in the resin.

Other examples of the conductive agent include metal particles such as silver particles and copper particles and nanoparticles of these.

The amount of the conductive agent to be added is generally 10 to 90 parts by mass, preferably 10 to 50 parts by mass, per 100 parts by mass of the resin or precursor resin of the invention.

Film Formation

A film of the thermoplastic resin or precursor resin thereof of the invention can be obtained by applying a solution containing the resin or its precursor resin and a solvent (the solution may be the liquid reaction mixture itself described above) to a substrate and then drying the coating to remove the solvent. Examples of the solvent include the same solvents as those enumerated above with regard to the liquid reaction mixture.

For the application may be used a method in which the solution is directly applied to an appropriate substrate such as a silicon wafer, by spin coating, spraying, or the like. In addition, use may be made of a method in which the solution is applied to a PET film or polyimide film by the comma coater method, fountain method, gravure coating, or the like to form a coating film and this coating film is transferred or laminated to an appropriate substrate such as a silicon wafer.

It is preferred that a heat treatment be further conducted after the solvent removal. For preventing the resin from being oxidatively deteriorated, it is desirable to conduct the heat treatment in an inert atmosphere such as a nitrogen atmosphere or vacuum at 250° C. or higher. Through this treatment, the volatile ingredients such as the solvent, which remain in the resin can be completely removed and, in the case of, e.g., a polyimide resin, complete imidization can be attained. However, this does not apply to the case where the resin has already been imidized and is in the form of a solution in a low-boiling solvent. In this case, heating to a temperature not lower than the boiling point of the solvent suffices. Unlike curable resins, the resin of the invention has no crosslinking structure and is soluble in solvents. Because of this, the resin which has been formed can be removed according to the necessity.

Examples of applications in which the resin of the invention can be used include the coverlays of flexible printed wiring boards and the coverlays or insulating films of thin-film silicon devices. In each of these applications, the substrate on which a resin is to be formed is thin and formation of an ordinary curable resin or high-Tg resin results in warpage due to the stress caused thereby. In addition, photocurability is required for efficiently conducting hole formation in electrical-connection parts.

Furthermore, the resin of the invention is applicable also to a part where two kinds of substrates differing in the coefficient of thermal (linear) expansion are connected to each other. The resin can relieve the stress generated by a difference in thermal expansion between the two substrates.

Besides being used in those applications, the resin of the invention can be used also as a resin for dust removal from semiconductor apparatus because of its low modulus. For example, the resin of the invention is formed on a silicon wafer and this wafer is conveyed through the apparatus so that the resin side is in contact with the stage, whereby foreign matters present on the stage can be removed. Thus, product wafers can be effectively inhibited from being contaminated by particles.

Moreover, the resin of the invention is applicable also to a part where two kinds of substrates differing in the coefficient of thermal (linear) expansion are connected to each other. The resin can relieve the stress generated by a difference in thermal expansion between the two substrates.

EXAMPLES

The modulus of elasticity was determined by examining viscoelastic properties by the tensile method and determining the storage modulus.

Storage modulus was determined by examining a sample with viscoelastomer RS-II (manufactured by Rheometric Scientific Inc.) at a frequency of 1 Hz and a strain of 0.3%.

Solder resistance was evaluated by forming a resin on a stainless-steel foil (SUS304 foil), immersing the resin-coated foil in a 260° C. solder bath for 10 seconds, and examining the coated foil for coating separation, resin deformation, or warpage.

Stress was evaluated by forming a resin on a stainless-steel foil (SUS304 foil 100-mm square and 25-μm thick), placing the resin-coated foil on a flat surface, and measuring the height of the part most apart from the surface due to warpage. The samples in which the heights were 2 mm or smaller, 2 to 5 mm, and 5 mm or larger are indicated by A, B, and C, respectively.

Example 1

In 533 g of N-methyl-2-pyrrolidone (hereinafter abbreviated to NMP) were dissolved 35.5 g of the diamine shown below (D-2000, manufactured by Mitsui Fine Chemicals, Inc.; n=33; molecular weight, about 2,000) and 19.4 g of 4,4'-diaminodiphenyl ether (hereinafter abbreviated to DDE). Subsequently, 25 g of pyromellitic dianhydride (hereinafter abbreviated to PMDA) was added thereto and reacted. The resin solution obtained was applied to a stainless-steel foil (SUS304 foil 100-mm square and 25-μm thick) with a spin coater and dried at 100° C. for 10 minutes. This coating film was heated-treated at 280° C. for 2 hours in a nitrogen atmosphere to form a resin coating film having a thickness of 20 μm. This resin-coated foil was examined for warpage amount. A half of this coated foil was immersed in a 260° C. solder bath for 10 seconds and examined for coating separation or resin deformation. Thereafter, the SUS foil was removed from the remaining half by etching with a ferric chloride solution, and the residual resin film was examined for the modulus of elasticity at each of 25° C. and 250° C. by the method shown above.

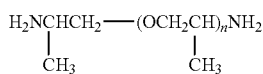

Example 2

An experiment was conducted in the same manner as in Example 1, except that 27.5 g of XTJ-502 shown below (D4000, manufactured by Mitsui Fine Chemicals, Inc.; the compound represented by the structural formula for D-2000 in Example 1 wherein n=68; molecular weight, about 4,000) was used in place of the D-2000 and that DDE, NMP, and PMDA were used in amounts of 15.2 g, 344 g, and 18.0 g, respectively.

Example 3

In 340 g of NMP were dissolved 27.2 g of the diamine shown below (XJT-542, manufactured by Mitsui Fine Chemicals, Inc.; a+c=6.0, b=9.0; molecular weight, about 1,000) and 12.9 g of DDE. Subsequently, 20 g of PMDA was added thereto and reacted. The resin solution obtained was applied to a stainless-steel foil (SUS304 foil 100-mm square and 25-μm thick) with a spin coater and dried at 100° C. for 10 minutes. This coating film was heat-treated at 280° C. for 2 hours in a nitrogen atmosphere to form a heat-resistant resin coating film having a thickness of 20 μm. Thereafter, warpage amount, solder resistance, and the modulus of elasticity were examined in the same manners as in Example 1.

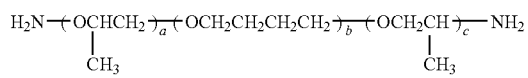

Example 4

To the resin solution obtained in Example 3 was added 9.0 g of the 1,4-dihydropyridine compound shown below. The resin solution thus obtained was applied to two stainless-steel foils (SUS304 foils 100-mm square and 25-μm thick) with a spin coater and dried at 100° C. for 10 minutes. One of the coating films was exposed to light with an extra-high-pressure mercury lamp (quantity of light, 300 mJ/cm$^2$) through a photomask. This coating film was heat-treated with a hot-air drying oven at 150° C. for 5 minutes. Thereafter, the unexposed areas of the coating film were removed by dissolution with 2.38% by mass aqueous tetramethylammonium hydroxide solution. This coating film was then rinsed with water to obtain a negative pattern. In this operation, the thickness of the exposed parts before the development was 24 μm and the thickness thereof after the development also was 24 μm. A high-contrast pattern could hence be obtained. Separately from this, the photosensitive solution was applied to a stainless-steel foil (SUS304 foil 100-mm square and 25-μm thick) with a spin coater and dried at 100° C. for 10 minutes. This coating film was heat-treated at 300° C. for 2 hours in a nitrogen atmosphere to form a heat-resistant resin coating film having a thickness of 20 μm. Warpage amount, solder resistance, and the modulus of elasticity were examined in the same manners as in Example 1.

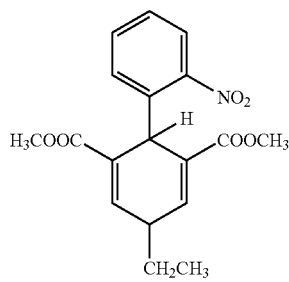

Example 5

A resin solution was obtained in the same manner as in Example 3, except that a 4% carbon dispersion (main component, NMP) was used in place of the NMP. The resin solution obtained was applied to a stainless-steel foil (SUS304 foil 100-mm square and 25-μm thick) with a spin coater and dried at 100° C. for 10 minutes. This coating film was heat-treated at 280° C. for 2 hours in a nitrogen atmosphere to form a resin coating film having a thickness of 20 μm. Warpage amount was measured. The surface resistivity of the resin obtained on the SUS foil was measured and, as a result, was found to be $10^{10}\Omega\square$. Namely, a semiconductive material could be obtained. A half of this sample was immersed in a 260° C. solder bath for 10 seconds and examined for coating separation or resin deformation.

Example 6

An experiment was conducted in the same manner as in Example 1, except that D-2000, DDE, NMP, and PMDA were used in amounts of 19.5 g, 21.0 g, 262 g, and 25.0 g, respectively.

Comparative Example 1

In 217 g of NMP was dissolved 18.4 g of DDE. Twenty grams of pyromellitic dianhydride (hereinafter abbreviated to PMDA) was added thereto and reacted. The resin solution obtained was applied to a stainless-steel foil (SUS304 foil 100-mm square and 25-μm thick) with a spin coater and dried at 100° C. for 10 minutes. This coating film was heat-treated at 280° C. for 2 hours in a nitrogen atmosphere to form a heat-resistant resin coating film having a thickness of 20 μm. Thereafter, warpage amount, solder resistance, and the modulus of elasticity were examined in the same manners as in Example 1.

Comparative Example 2

In 188.4 g of NMP, 17.1 g of 4,9-dioxa-1,12-dodecanediamine was reacted with 30.0 g of 4,4'-hydroxydiphthalic dianhydride. The resin solution obtained was applied to a stainless-steel foil (SUS304 foil 100-mm square and 25-μm thick) with a spin coater and dried at 100° C. for 10 minutes. This coating film was heat-treated at 280° C. for 2 hours in a nitrogen atmosphere to form a resin coating film having a thickness of 20 μm. Thereafter, warpage amount, solder resistance, and the modulus of elasticity were examined in the same manners as in Example 1.

The results obtained in the Examples and Comparative Examples are summarized in Table 1. Furthermore, a comparison among the temperature profiles of the moduli of elasticity of the resins obtained in Example 3, Comparative Example 1, and Comparative Example 2, as examples, is given in the FIGURE in order to show temperature dependency of the modulus of elasticity. In the FIGURE, A indicates Example 3 and B and C indicate Comparative Examples 1 and 2, respectively.

The resins obtained in Examples 1 to 4 and 6 each were transparent, and no domains of at least 0.1 μm or larger were observed therein even in an examination with a transmission electron microscope (TEM).

TABLE 1

| | Storage modulus | | | |
| | 25° C. (MPa) | 250° C. (MPa) | Warpage | Solder resistance |
|---|---|---|---|---|
| Example 1 | 469 | 105 | A | A |
| Example 2 | 451 | 160 | A | A |
| Example 3 | 328 | 70 | A | A |
| Example 4 | 380 | 79 | A | A |
| Example 5 | — | — | A | A |
| Example 6 | 780 | 260 | B | A |
| Comparative Example 1 | 2810 | 1650 | C | A |
| Comparative Example 2 | 1110 | <1 | B | C |

It can be seen from the results given in Table 1 that the resin coating films of Examples 1 to 5, which have a modulus of elasticity at 25° C. of 1 GPa or lower and a modulus of elasticity at 250° C. of 1 MPa or higher, are satisfactory in each of warpage and solder resistance.

Example 7

A heat-resistant resin coating film having a thickness of 20 μm was formed on an SUS304 foil 100-mm square and 25-μm thick in the same manner as in Example 3. Subsequently, the rate of etching by a plasma treatment was examined in order to conduct pattern formation by plasma etching. The plasma treatment was conducted with Super V600, manufactured by Mori Engineering, using an argon plasma (pressure, 33.6 Pa; 300 W). The rate of etching was calculated from a film thickness reduction through 10-minute etching. As a result, the etching rate was found to be 0.1 μm/min or lower. An oxygen plasma (pressure, 100 Pa; 200 W) also was used to conduct etching. As a result, the etching rate was 0.1 μm/min or lower in this etching also. These values are not larger than 1/20 the rate of etching of the photosensitive material of Example 4 (2 μm/min to 4 μm/min).

Incidentally, practical patterning necessitates a process for forming a hard mask for pattern formation, besides etching.

BRIEF DESCRIPTION OF THE DRAWING

The FIGURE is graphs showing the temperature profiles of the moduli of elasticity of the resins obtained in Example 3, Comparative Example 1, and Comparative Example 2.

The invention claimed is:

1. A dust removal member comprising a silicon wafer and a thermoplastic resin formed on the silicon wafer, wherein the thermoplastic resin has a modulus of elasticity at room temperature, 25° C., of 1 GPa or lower and a modulus of elasticity at 250° C. of 1 MPa or higher.

2. The dust removal member according to claim 1, wherein the thermoplastic resin has no sea-island structure of 0.1 μm or larger and is transparent.

3. The dust removal member according to claim 1, wherein the thermoplastic resin has a siloxane content of lower than 10% by mass.

4. The dust removal member according to claim 1, wherein the thermoplastic resin is a polyimide resin obtainable by reacting a tetracarboxylic dianhydride with a diamine compound, said diamine compound being a diamine compound which has two ends having an amine structure and has a polyether structure.

5. The dust removal member according to claim 4, wherein the diamine compound, which has two ends having an amine structure and has a polyether structure, has a number-average molecular weight of 500 or higher; and wherein the resin contains the polyether structure of the diamine compound in a proportion of 40 to 60% by weight.

6. The dust removal member according to claim 1, which the thermoplastic resin further comprises a photosensitizing agent.

7. The dust removal member according to claim 6, wherein the thermoplastic resin further comprises:

a 1,4-dihydropyridine compound represented by the formula (I):

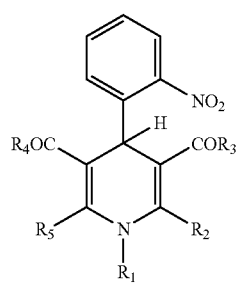

(I)

wherein $R_1$ to $R_5$ each independently represent a hydrogen atom or an organic group having 1 to 4 carbon atoms.

8. The dust removal member according to claim 1, wherein the thermoplastic resin further comprises a carbon powder.

* * * * *